United States Patent
Nicolai et al.

(10) Patent No.: US 7,057,893 B2
(45) Date of Patent: Jun. 6, 2006

(54) COOLING ARRAY

(75) Inventors: Michael Nicolai, Rabenau (DE); Martin Dörrich, Sinn (DE)

(73) Assignee: Rittal GmbH & Co. KG, Herborn (DE)

( * ) Notice: Subject to any disclaimer, the term of this patent is extended or adjusted under 35 U.S.C. 154(b) by 0 days.

(21) Appl. No.: 10/500,733

(22) PCT Filed: Jan. 11, 2003

(86) PCT No.: PCT/EP03/00212

§ 371 (c)(1), (2), (4) Date: Jul. 2, 2004

(87) PCT Pub. No.: WO03/077625

PCT Pub. Date: Sep. 18, 2003

(65) Prior Publication Data

US 2005/0117297 A1 Jun. 2, 2005

(30) Foreign Application Priority Data

Mar. 11, 2002 (DE) ................................ 102 10 480

(51) Int. Cl.
*H05K 7/20* (2006.01)

(52) U.S. Cl. ..................... 361/699; 361/689; 174/15.1; 165/80.4; 165/104.33

(58) Field of Classification Search ........ 361/688–690, 361/698, 699, 701–704, 711, 717–721; 174/15.1; 165/80.4, 104.33; 257/714

See application file for complete search history.

(56) References Cited

U.S. PATENT DOCUMENTS

| | | | | | |
|---|---|---|---|---|---|
| 3,609,991 | A | * | 10/1971 | Chu et al. ...................... | 62/333 |
| 3,774,677 | A | * | 11/1973 | Antonetti et al. ............ | 165/285 |
| 3,817,321 | A | * | 6/1974 | Von Cube et al. ...... | 165/104.22 |
| 4,514,746 | A | | 4/1985 | Lündqvist | |
| 5,406,807 | A | * | 4/1995 | Ashiwake et al. ............. | 62/376 |
| 5,509,468 | A | * | 4/1996 | Lopez ......................... | 165/144 |
| 5,740,018 | A | * | 4/1998 | Rumbut, Jr. ................. | 361/720 |
| 6,330,153 | B1 | * | 12/2001 | Ketonen et al. ............ | 361/690 |
| 6,490,877 | B1 | * | 12/2002 | Bash et al. .................... | 62/200 |
| 6,498,725 | B1 | * | 12/2002 | Cole et al. ................... | 361/700 |
| 6,519,955 | B1 | * | 2/2003 | Marsala ........................ | 62/119 |
| 6,536,510 | B1 | * | 3/2003 | Khrustalev et al. .... | 165/104.33 |

(Continued)

FOREIGN PATENT DOCUMENTS

| | | |
|---|---|---|
| DE | 2 138 376 | 2/1973 |
| DE | 75 00 696 | 11/1976 |
| DE | 39 31 570 C1 | 3/1991 |
| DE | 101 12 389 A1 | 10/2002 |
| EP | 0 767 601 A1 | 4/1997 |

*Primary Examiner*—Boris Chervinsky
(74) *Attorney, Agent, or Firm*—Pauley Petersen & Erickson

(57) ABSTRACT

A cooling array including a housing accommodating electrical built-in components and an air conditioning device that is connected to a heat source of the electrical built-in components by a coolant-carrying inlet line and a return line. To simply air-condition complex systems having a plurality of electrical built-in components, several device inlet lines come out from the inlet line and device return lines come out from the return line and each electrical built-in component is assigned at least one device inlet line and at least one device return line.

2 Claims, 1 Drawing Sheet

U.S. PATENT DOCUMENTS

| | | | |
|---|---|---|---|
| 6,807,056 B1 * | 10/2004 | Kondo et al. | 361/689 |
| 6,828,675 B1 * | 12/2004 | Memory et al. | 257/714 |
| 6,888,720 B1 * | 5/2005 | Pfister et al. | 361/689 |
| 6,970,355 B1 * | 11/2005 | Ellsworth et al. | 361/694 |
| 2002/0007641 A1 | 1/2002 | Marsala | |
| 2002/0021557 A1 | 2/2002 | Ishimine et al. | |

* cited by examiner

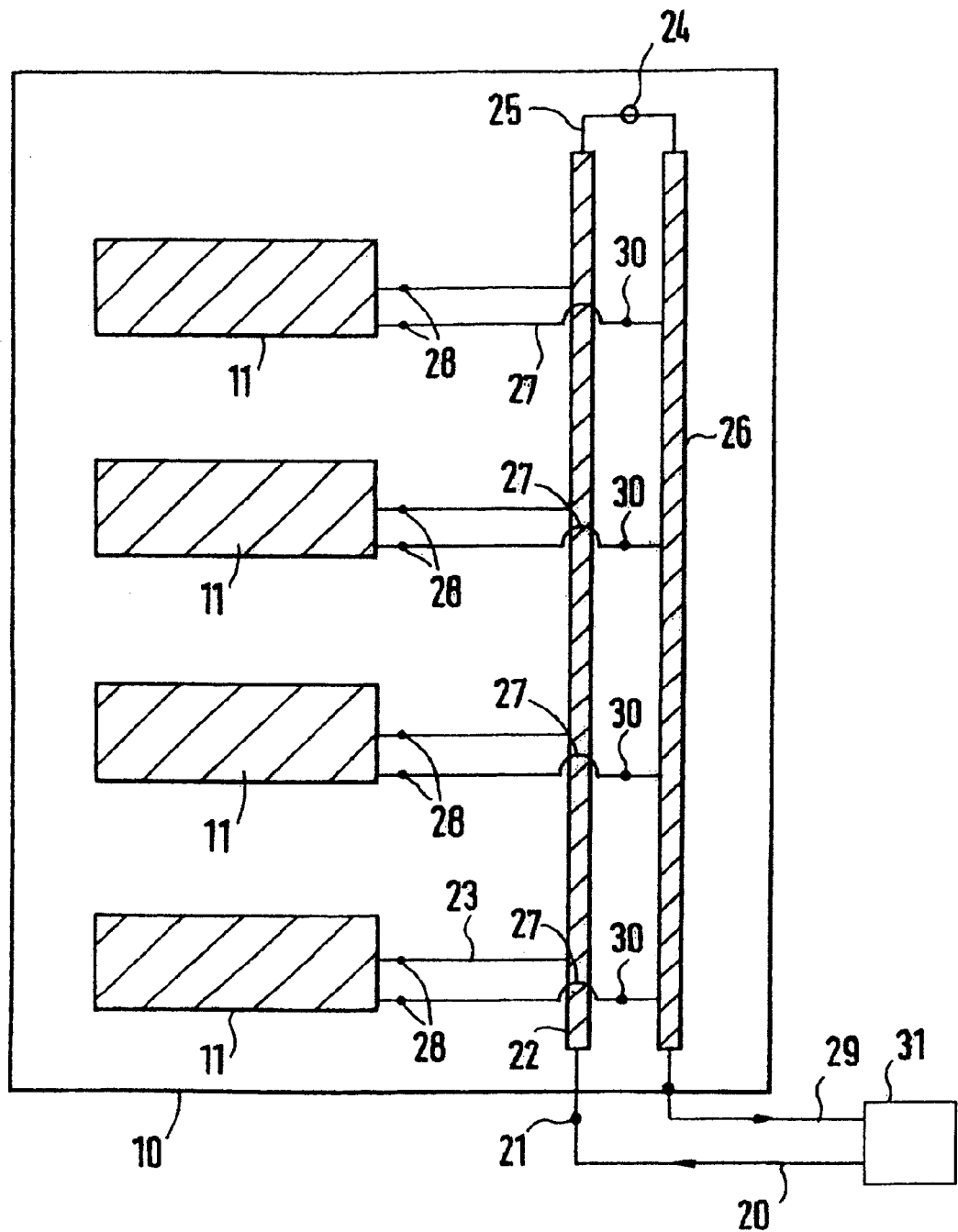

COOLING ARRAY

BACKGROUND OF THE INVENTION

1. Field of the Invention

This invention relates to a cooling array with a housing receiving built-in electrical components and with an air conditioning arrangement, which is connected with a heat source of the built-in electrical components via a coolant-conducting inflow line and an outflow line, wherein several component inlet lines branch off the inflow line and several component outflow lines branch off the outflow line, at least one component inlet line and at least one component outflow line is assigned to a built-in electrical component, and an inlet line and a return flow line branch off the air conditioning arrangement and are connected to the inflow line and the outflow line.

2. Discussion of Related Art

A cooling arrangement is taught by U.S. Pat. No. 4,514,746. With this known structure the individual lines, which the connection with the air conditioning device and the consumers, for example the built-in electrical components which are to be cooled, represent a complete system which is designed for a clearly defined number of built-in components. It is thus not possible to change the structure of the cooling arrangement in a simple manner and to reduce and/or increase the number of built-in components.

For obtaining a flexible cooling arrangement, according to this invention the connectors are formed by coupling devices, and the coupling connections are embodied as couplings which can be separated or joined in a dripless manner. The inflow lines and/or the outflow line each is embodied as a rigid profiled leg and forms a guide channel for the coolant, for example water.

The built-in electrical components can be individually connected or disconnected by the coupling devices, without not interfering with the remaining circulation of the other built-in components in the cooling arrangement. Also, the inflow and/or outflow lines embodied as rigid profiled legs with guide phases for the coolant can easily be embedded in the switchgear cabinet and are available as connecting options for built-in electrical components over the entire height of the switchgear cabinet.

The inflow and the outflow lines are connected with an air conditioning arrangement, which can be an installation operating in accordance with an evaporation principle.

The component inlet and outflow lines have coupling elements at their ends, which can be joined with correspondingly designed counter-coupling elements to form coupling connections.

SUMMARY OF THE INVENTION

It is one object of this invention to provide a cooling array of the type mentioned above but which makes possible the air conditioning of complex systems with a multitude of built-in electrical components in a simple manner.

This object is achieved by several component inlet lines branching off the inflow line and several component outflow lines branching off the outflow line. At least one component inlet line and at least one component outflow line is assigned to a built-in electrical component.

With this cooling array it is possible to specifically remove large amounts of heat from a multitude of built-in electrical components. The collection of the removed amounts of heat occurs in the outflow line. It is thus possible to individually connect the built-in electrical components to a component inlet line and a component outflow line. If several heat sources within a built-in component must be cooled, several component inlet lines and component outflow lines can also be connected. A large degree of flexibility is thus achieved.

The inflow line the outflow line are conducted to an air conditioning arrangement that can be operating on the basis of an evaporation principle. For reasons of space, the air conditioning arrangement is preferably arranged outside the housing and exchanges the heat energy removed from the housing with the surroundings. Thus, one advantage of this system is that it is possible to remove relatively large amounts of heat from the housing. This allows the placement of components in the housing interior in a very compact form.

In accordance with one embodiment of this invention, the component inlet and the component outflow lines have connecting elements at their ends, which can be joined together with corresponding counter-connecting elements to form coupling connections. Transfer points are made available to a user by this arrangement. The user can thus perform the connection of the cooling array with the respective built-in electrical component via the coupling connections.

In one embodiment, the cooling arrangement can be such that an inlet and a return flow line branch off the air conditioning arrangement and are connected to the inflow line and the outflow line, and the connections are formed by coupling connections. In that case the housing can be installed in the form of a system and can be connected simply and quickly with the air conditioning arrangement.

In order to prevent amounts of water which would endanger the built-in electrical components from flowing out near or in the area of the coupling connection during installation operations, the coupling connections are embodied as couplings which can be separated and joined without dripping. This type of a coupling connection also makes it possible to later change an operating cooling array. Accordingly, the built-in electrical components can also be connected or disconnected without problems, while the cooling array is operating.

In one embodiment of this invention, the housing is a switchgear cabinet, in whose rear area forms a receiving space for the vertically extending inflow line and outflow line.

For achieving problem-free ventilation with this arrangement, in the roof area of the housing the inflow line makes a transition into the outflow line via a connecting line, and a ventilating device is integrated into the connecting line.

The available cooling output at a built-in electrical component can be varied in a simple manner if the amount of coolant conducted to the built-in electrical components can be controlled by a governor integrated into the component inlet line or the component outflow line.

In accordance with one embodiment of this invention, the inflow line and/or the outflow line are embodied as rigid profiled legs, which form a guide channel for the coolant, for example water. The profiled leg can be an extruded profiled section.

In accordance with one embodiment, the housing has a support frame with vertical profiled sections, and the inflow line and/or the outflow line each is integrated into at least one profiled section.

BRIEF DESCRIPTION OF THE DRAWING

This invention is explained in greater detail in view of exemplary embodiments represented in the drawing that shows a schematic diagram of a cooling array.

DESCRIPTION OF PREFERRED EMBODIMENTS

The drawing shows a cooling array in a schematic representation in which a vertically extending inflow line 22 and an outflow line 26 are arranged in a housing 10. Built-in electrical components 11 are placed inside the housing 10 and contain heat sources which are to be cooled. Respectively, one component inlet line 23 branches off the inflow line 22, and respectively one component outflow line 27 off the outflow line 26. In this case the built-in electrical components 11, which are switched parallel with each other, are connected to the inflow line 22 or the outflow line 26. The connection of the built-in components 11 is provided by coupling connections 28, which can be joined and separated without dripping.

A governor 30 is integrated into the component outflow line for regulating the cooling output and regulates the amount of flow-through of coolant.

The inflow line 22 and the outflow line 26 are connected to an inlet line 20, or an outflow line 29 via coupling connections 21 and lead to an air conditioning arrangement 31. The heat from the coolant, preferably water, is exchanged in the air conditioning arrangement 31.

For providing ventilation of the system, a ventilating device 24 is installed near or in the area of a connecting line 25. The connecting line 25 is arranged near or in the area of the housing roof.

The invention claimed is:

1. A cooling array with a housing (10) receiving built-in electrical components (11) and an air conditioning arrangement connected with a heat source of the built-in electrical components via a coolant-conducting inflow line (22) and an outflow line (26), wherein a plurality of component inlet lines (27) branch off the inflow (22) line and a plurality of component outflow lines (23) branch off the outflow line (26), at least one component inlet line (27) and at least one component outflow line (23) each is assigned to a built-in electrical component (11), wherein an inlet line (20) and a return flow line (29) branch off the air conditioning arrangement and are connected to the inflow line (22) and the outflow line (26), the cooling array comprising:

the connections formed by coupling connections (21);

the coupling connections (21) formed as couplings which can be separated and joined without dripping;

at least one of the inflow line (22) and the outflow line (26) formed as rigid profiled legs which form a guide channel for the coolant;

the component inlet lines (27) and the component outflow lines (23) including connecting elements at ends which can be joined together with corresponding counter-connecting elements to form coupling connections (28);

the housing (10) comprising a switchgear cabinet with a rear area forming a receiving space for the vertically extending inflow line (22) and outflow line (26);

the inflow line (22) transitioning into the outflow line (26) via a connecting line (25) near a roof area of the housing (10), and a ventilating device (24) integrated into the connecting line (25); and a governor (30) integrated into one of the component inlet line (27) and the component outflow line (23) for controlling an amount of the coolant conducted to the built-in electrical components (11).

2. The cooling array in accordance with claim 1, wherein the coolant comprises water.

\* \* \* \* \*